United States Patent [19]
Wang et al.

[11] Patent Number: 5,215,962
[45] Date of Patent: Jun. 1, 1993

[54] 90 K TL-BA-CE-CU-O SUPERCONDUCTOR AND PROCESSES FOR MAKING SAME

[75] Inventors: J. H. Wang, Boulder, Colo.; Zhengzhi Sheng, Fayetteville, Ark.; Allen M. Hermann, Golden, Colo.

[73] Assignee: The University of Arkansas, Little Rock, Ark.

[21] Appl. No.: 782,868

[22] Filed: Oct. 15, 1991

Related U.S. Application Data

[63] Continuation of Ser. No. 484,844, Feb. 26, 1990, abandoned.

[51] Int. Cl.$^5$ ...................... C04B 41/89; H01L 39/12
[52] U.S. Cl. ...................................... 505/1; 505/783; 501/123; 501/152; 252/518; 252/521
[58] Field of Search ............... 505/783, 1; 501/123, 501/152; 252/518, 521

[56] References Cited

U.S. PATENT DOCUMENTS

| | | | |
|---|---|---|---|
| 4,755,493 | 7/1988 | Takeuchi et al. | 501/134 |
| 4,870,052 | 9/1989 | Engler et al. | 505/1 |
| 4,880,773 | 11/1989 | Itozaki et al. | 505/1 |
| 4,994,432 | 4/1991 | Hermann et al. | 505/783 |

FOREIGN PATENT DOCUMENTS

| | | |
|---|---|---|
| 0280812 | 9/1988 | European Pat. Off. |
| 0284062 | 9/1988 | European Pat. Off. |
| 0286289 | 10/1988 | European Pat. Off. |
| 0292340 | 11/1988 | European Pat. Off. |
| 0301952 | 2/1989 | European Pat. Off. |
| 0301958 | 2/1989 | European Pat. Off. |
| 0316009 | 5/1989 | European Pat. Off. |
| 236794 | 10/1988 | Japan . |

OTHER PUBLICATIONS

Saito et al., "High-$T_c$ Superconducting Properties in $(Y_{1-x}Tl_x)Ba_2Cu_3O_{7-x}$. . . " Physica 148B, 1987, 336-338.

Wang et al., "The 90k bulk superconductivity in the Thallium-Barium-Cerium-Copper-Oxygen System", Physica C 158(3) pp. 507-510, 1989.

Zhang et al., "The copper valence state and structure of lithium, cerium, europien, vanadium-doped ytthium-barium-copper-oxide system", Mod. Phy. Lett. B, 3(12), 955-60, 1989 abstract.

Sheng et al., "Superconductivity in the rare-earth-free Tl-Ba-A-O System above liquid-nitrogen temperature", Nature, vol. 332(3) 3 Mar. 1988.

Wu et al., "Bulk Superconductivity with $T_cO$ up to 95K in a Tl-Pb-Ca-Ce-Sr-Cu-O with a $YBa_2Cu_3O_y$-like structure", Appl. Phys. Lett 54(24) 2464-6 1989 (abstract).

Rao et al, "Superconductivity (1:1:2:2:)-type layered cuprates of the formula $TlCa_{1-x}T_xSr_2Cu_2O_y$(T-Yr rare earth element) Physical Review vol. 40 #4, 2565-67 Aug. 1, 1989.

Inoue et al., "Superconductivity in a Tl-Sr-Y-Cu-O System" Jap. Jour Appl Phys. vol. 28 #8, 1375-77 Aug. 1989.

Gangichi et al., "Superconductivity in Bi-Ca-Y-Si-Ca-O ac Tl-Ca-Y-Ba-Ci-O" Mat'l Res Bull vol. 24, pp. 103-109 Jan. 1989.

Wang et al., "the 90K bulk superconductivity in the thallium-barium-cerium-copper-oxygen system", Physica C, 158(3), pp. 507-510, 1989-abstract & comp search.

Sheng et al, "Superconductivity in the R-Tl-Sr-Cu-O system with R-Rare Earth", Solid State Comm., vol. 71, #9, pp. 739-741, 1989.

(List continued on next page.)

Primary Examiner—Mark L. Bell
Assistant Examiner—C. M. Bonnar
Attorney, Agent, or Firm—Hermann Ivester

[57] ABSTRACT

A high temperature superconductor system having the nominal composition: Tl-Ba-Ce-Cu-O. The high temperature superconductor of the present invention has a transition temperature of about 90 K. Processes for making the high temperature superconductor are also provided.

19 Claims, 4 Drawing Sheets

OTHER PUBLICATIONS

Hasegawa, T., et al., *High T. Superconductivity of $(La_{1-x}Sr_xCuO_4$-Effect of Substition . . . Superconductivity*, Japan Journal of Applied Physics, vol. 26, No. 4, Apr. 20, 1987, L337–L338.

Kishio, K., et al., *Effect of Lanthanide Ion Substitutions for Lanthanum Sites on Supercondicutivity of $(LA_{1-x}Sr_x)_2CuO_{4-o}$* Japanese Journal of Applied Physics, vol. 26, No. 4, Apr. 20, 1987, L391–L393.

Ohshima, S., et al., *Superconducting and Structural Properties of the New $Ba_{1-x}Ln_xCuO_{3-y}$ Compound System (Ln=La, Ce, Pr, Nd, Sm, Eu, . . . and Yb)*, Japanese Journal of Applied Physics, vol. 26, No. 5, May 1987, L815–L817.

Tsurumi, S., et al., High T. Superconductivities of $A_2Ba_4Cu_6O_{14+y}$ Japanese Journal of Applied Physics, vol. 26, No. 5, May 1987, L856–L857.

Superconductivity News, vol. 1, No. 2, Aug. 1987, pp. 1, 2, and 6–8.

Yang, K. N., et al., *High Temperature Superconductivity in Rare-Earth (R)-Barium Copper Oxides $(RBa_2Cu_3O_{9-\delta}$*, Solid State Communications, vol. 63, No. 6, 1987, pp. 515–519.

Tarascon, J. M., et al., *Oxygen and Rare-Earth Doping of the 90-K Superconducting Perovskite $YBa_2Cu_3O_{7-x}$*, Physical Review B, vol. 36, No. 1, 1987, 226–234.

Hor, P. H., et al., *Superconductivity Above 90 K in the Square-Planar Compound System $ABa_2Cu_3O_{6+x}$ with A=Y, La, Nd, Sm, Eu, Gd, Ho, Er, and Lu*, Physical Review Letters, vol. 58, No. 18, 1987, 1891–1894.

Khurana, A., *Superconductivity Seen Above the Boiling Point of Nitrogen*, Physics Today, Apr. 1987, 17–23.

Cava, R. J., et al., *Bulk Superconductivity at 91 K in Single-Phase Oxygen-Deficient Perovskite $Ba_2YCu_3O_{9-\delta}$*, Physical Review Letters, vol. 58, No. 16, 1987, 1676–1679.

Nagashima, T., et al., *Superconductivity in $Tl_{1.5}SrCaCu_2O_x$*, Japanese Journal of Applied Physics, vol. 27, No. 6, Jun. 1988, L1077–L1079.

Saito, T., et al. *High-$T_c$ Superconducting Properties in $(Y_{1-x}Tl_x)Ba_2Cu_3O_{7-y}$, $Y(Ba_{1-x}K_x)_2Cu_3O_{7-y}$ and $YBa_2(Cu_{1-x}Mg_x)_3O_{7-y}$*, Physica 148B, 1987, 336–338.

Kondoh, S., et al., *Superconductivity in Tl-Ba-Cu-O System*, Solid State Communications, vol. 65, No. 11, 1988, 1329–1331.

Sera, M. et al., *On the Structure of High-$T_c$ Oxide System Tl-Ba-Cu-O*, Institute for Molecular Science, Myodaiji, Okazaki 444 Japan, 1988, Feb.

Ihara, H. et al., *Possibility of Superconductivity at 65° C. in Sr-Ba-Y-Cu-O System*, Japanese Journal of Applied Physics, vol. 26, No. 8, Aug. 1987, L1413–L1415.

Ishida, T., *Compositional Variation of High $T_c$ in $Yb_x$-$Er_{1-x}Ba_2Cu_3O_{6+y}$ System*, Japanese Journal of Applied Physics, vol. 26, No. 8, Aug. 1987, L1294–L1295.

Kijima, T., et al., *Superconductivity in the Bi-Sr-La-Cu-O System*, Japanese Journal of Applied Physics, vol. 27, No. 6, Jun. 1988, L1035–L1037.

Richert, B., et al., *Atomic Substitution in $YBa_2Cu_3O_7$: Modification of the Electronic Structure*, American Institute of Physics Conference Proceedings No. 165 (Thin Film Processing and Characterization of High-Temperature Superconductors), Nov. 6, 1987, 277–283.

Ferreira, J. M., et al., *Long-range Magnetic Ordering the High-$T_c$ Superconductors $RBa_2Cu_3O_{7-\delta}$ R=Nd, Sm, Gd, Dy and Er)*, Physical Review B, vol. 37, Nov. 4, Feb. 1, 1988, 2368–2371.

Shih, I., et al., *Multilayer Deposition of Thallium Barium Calcium Copper Oxide Films*, Applied Physics Letter 53(6), 1988, 523–525.

Ginley, D. S., et al., *Sequential Electron Beam Evaporated Films of $Tl_2CaBa_2Cu_2O_y$ with Zero resistance at 97 K*, Applied Physics Letters, 53 (5), Aug. 1, 1988, 406–408.

Qiu, C. X., et al., *Formation of Tl-Ca-Ba-Cu-O Films by Diffusion of Tl into rf-sputtered Ca-Ba-Cu-O*, Applied Physics Letters, 53 (12), Sep. 19, 1988, 1122–1124.

Gopalakrishnan, I. K., et al., *Synthesis and Properties of a 125 K Superconductor in the Tl-Ca-Ba-Cu-O System*, Applied Physics Letters, 53 (5), Aug. 1, 1988, 414–416.

Parkin, S. S. P., et al., *Bulk Superconductivity at 125 K in $Tl_2Ca_2Ba_2Cu_3O_x$*, Physical Review, Jun. 1988, 2539–2542.

Sheng, Z. Z., et al., *Superconductivity at 90 K in the Tl-Ba-Cu-O System*, Physical Review Letters, vol. 60, No. 10, Mar. 7, 1988, 937–940.

Sheng, Z. Z., et al., *Bulk Superconductivity at 120 K in the Tl-Ca/Ba-Cu-O System*, Nature, vol. 332, Mar. 10, 1988, 138–139.

Ihara, H., et al., *A New High-$T_c$ $TlBa_2Ca_3Cu_4O_{11}$ Superconductor with $T_2>120$ K*, Nature, vol. 334 11 Aug. 1988, 510–511.

(List continued on next page.)

OTHER PUBLICATIONS

Sheng, Z. Z., et al., *$Tl_2O_3$ Vapor Process of Making Tl--Ba-Ca-Cu-O Superconductors*, Appl. Phys. Lett. 53 (26), 26 Dec. 1988, 2686–2688.

Hazen, R. M., et al., *100-K Superconducting Phases in the Tl-Ca-Ba-Cu-O System*, Physical Review Letters, vol. 60, Mo. 16, 18 Apr. 1988, 1657–1660.

Sheng, Z. Z., et al., *New 120 K Tl-Ca-Ba-Cu-O Superconductor*, Appl. Phys. Lett., vol. 52, No. 20, 16 May 1988, 1738–1740.

Lin, R. J., et al., *Forming Superconducting Tl-Ca-Ba-Cu-O Thin Films by the Diffusion Method*, Japanese Journal of Applied Physics, vol. 28, No. 1, Jan. 1989, L85 L85–L87.

Thompson, B. J., et al., *Preparation of High $T_c$ Tl-Ba-Ca-Cu-O Thin Films by Pulsed Laser Evaporation and $Tl_2O_3$ Vapor Processing*, Appl. Phys. Lett. 54(18), 1 May 1989, 1810–1811.

Sugise, R., et al., *Preparation $Tl_2Ba_2Ca_2CU_3O_y$ Thick Films from Ba-Ca-Cu-O Films*, Japanese Journal of Applied Physics, vol. 27, No. 12, Dec. 1988, L2314–L2316.

Hatta, S., et al., *Pt-coated Substrate Effect on Oxide Superconductive Films in Low-Temprature Processing*, Appl. Phys. Lett. 53 (2), 11 Jul. 1988, 148–150.

Lee, W. Y., et al., *Superconducting Tl-Ca-Ba-Cu-O Thin Films With Zero Resistance at Temperatures of up to 120 K*, Appl. Phys. Lett. 53 (4), 25 Jul. 1988, 329–331.

Oota, A., et al., *Electrical, Magnetic and Superconducting Properties of High-$T_c$ Superconductor (Y, Sc)-(Ba, Sr)-Cu Oxide*, Japanese Journal of Appl Physics, vol. 26, No. 8, Aug. 1987, L1356–1358.

Iwazumi, T., et al., *Identification of a Structure with Two Superconducting Phases in L-Ba-Cu-O System (L=La or Y)*, Japanese Journal of Applied Physics, vol. 26, No. 5, May, 1987, L621–L623.

Capone, II., D. W., et al., *Super Critical Fields and High Superconducting Transition Temperatures of $La_{1.85}Sr_{0.15}CuO_4$ and $La_{1.85}Ba_{0.15}CuO_4$*, Appl. Phys. Lett 50 (9), 2 Mar., 1987, 543–544.

Johnson, D. W., et al., *Fabrication of Ceramic Articles from High $T_c$ Superconducting Oxides*, Materials Research Society, Symposium S Proceedings (High Temperature Superconductors), Apr. 1987, 193–195.

Garwin, L, *Superconducting Conference Yields New Temperature Record*, Nature vol. 332 10 Mar. 1988.

Suzuki, A., et al., *Rare- Earth(RE)-Barium Solubility Behavior in $y(Ba_{z-x}RE_x)Cu_3O_{7+\delta}$ and $Sm(Ba_{z-x}RE_x)Cu_3O_{7+\delta}$*, Japanese Journal of Applied Physics, vol. 27, No. 5, May, 1988, L792–L794.

Nagashima, T., et al., *Improving Superconducting Characteristics of Tl-Sr-Ca-Cu-O by Doping with Pb and/or Rare-Earth elements*, Japanese Journal of Applied Physics, vol. No. 6, Jun. 1989, L930–L933.

Vijayaraghaven, R., et al., *Investigations of Novel Cuprates of the $TlCa_{1-x}Ln_xSr_2Cu_2O_{7-\delta}(n=rare\ earth)$ Series Showing Electron-or Hole-superconductivity Depending on the Composition*, Superconducting Science and Technology, vol. 2(3), Sep. 1989, 195–201.

Peters, P. N., et al., *Observation of Enhanced Properties in Samples of Silver Oxide Doped $YBa_2Cu_3O_x$*, Appl. Phys. Lett 52 (24), 13 Jun. 1988, 2066–2067.

S. Natarajan et al., *Superconductivity Studies on $(Y_{1-x}Ln_x)Ba_2Cu_3O_7$, Ln=La, Pr,Tb*, Physica C, vol. 153–155, Feb. 1988, 926–927.

D. D. Sarma, et al., *Electronic Structure of High-$T_c$ Superconductors from Soft-x-ray Absorption*, Physical Review B, vol. 37, No. 16, Jun. 1988, 9784–9787.

K. Kishio, et al., *Superconductivity Achieved at Over Liquid Nitrogen Temperature by (mixed Rare Earths)-Ba-Cu Oxides*, Japanese Journal of Applied Physics, vol. 26 No. 5, May 1987, L694–L696.

Waldrop, M. Mitchell, *Thallium Superconductor Reaches 125K*, Research News, Mar. 1988, 1243.

Qadri, S. B., et al., *x-ray Identification of the Superconducting High-$T_c$ Phase in the Y-Ba-Cu-O systems*, Physical Review B, vol. 35, No. 13, 1987.

Murphy, D. W., et al., *New Superconducting Cuprate Perovskites*, Physical Review Letters, vol. 58, May 1987, 1888–1890.

90 K TL-BA-CE-CU-O SUPERCONDUCTOR AND PROCESSES FOR MAKING SAME

This is a continuation of application Ser. No. 484,844, filed Feb. 26, 1990, now abandoned.

BACKGROUND OF THE INVENTION

The present invention relates generally to high temperature superconductors. More specifically, the present invention relates to Tl-Ba-Ce-Cu-O superconductors and processes for making same.

Tl-Ba-Cu-O and Tl-Ba-Ca-Cu-O superconducting systems have been identified. U.S. patent application Ser. No. 144,114 and Ser. No. 155,247, now U.S. Pat. No. 4,962,083, issued Oct. 9, 1990 filed in the name of Hermann and Sheng, two of the three inventors of the present invention, disclose, in part, Tl-Ba-Cu-O and Tl-Ba-Ca-Cu-O superconductor systems. The discovery of the Tl-Ba-Cu-O and Tl-Ba-Ca-Cu-O superconducting systems has led to the identification of a number of Tl-based superconducting compounds, including the series $Tl_mBa_2Ca_{n-1}Cu_nO_{1.5m+2n+1}$, wherein $m=1-2$ and $n=1-5$.

One of the phases of the Tl-Ba-Ca-Cu-O system that has been identified is the $Tl_2Ba_2Ca_2Cu_3O_{10}$ superconductor phase. This phase has a transition temperature of 125 K., which transition temperature, the inventors of the present invention believe, is the highest to date among existing high temperature superconductors.

The presently known phases of such high $T_c$ superconductors have a tetragonal structure and are p-type. These superconductive phases are also anisotropic. If a new superconductor system was discovered that had a different structure, it could be used for several special applications.

SUMMARY OF THE INVENTION

The present invention provides a new superconductor system and method for making same. To this end, the present invention provides a high temperature superconductive system containing thallium (Tl), barium (Ba), cerium (Ce), copper (Cu), and oxygen (O):

In a preferred embodiment of the present invention, the superconductive system of the present invention has the following approximate stiochiometry:

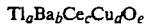

wherein:
$1.1 \leq a \leq 2.2$;
$1.8 \leq b \leq 2.2$;
$0.5 < c < 1.5$
$1.1 \leq d \leq 4$; and
$5.55 < e < 12.5$.

In an embodiment of the present invention, the superconductor has a nominal composition of $Tl_{2.2}Ba_2CeCu_3O_{10.3}$ and is superconducting at 90 K.

A method of producing the high temperature superconductors is also provided. The method of the present invention allows the superconductor to be prepared at temperatures of approximately 900° to about 925° C. in flowing oxygen. Accordingly, the method of the present invention allows the superconductor to be formed at relatively low temperatures. Furthermore, the method of the present invention allows the superconductor to be produced rapidly, in that it need only be heated for approximately 3 to about 5 minutes.

Accordingly, it is an advantage of the present invention to provide a new superconductor composition.

It is a further advantage of the present invention to provide a new method for making superconductors.

Additional advantages and features of the present invention are described in, and will be apparent from, the detailed description of the presently preferred embodiments and from the drawings.

DETAILED DESCRIPTION OF THE PRESENTLY PREFERRED EMBODIMENT

The present invention provides a new high temperature superconductor system and method of making same. As used herein, the term "high temperature" refers to a temperature above the boiling point of liquid nitrogen.

The superconductor system of the present invention has the following general formula:

In an preferred embodiment of the present invention, a superconductor constructed from the new superconductive system of the present invention has the following approximate stoichiometry:

wherein:
$1.1 \leq a \leq 2.2$;
$1.8 \leq b \leq 2.2$;
$0.5 < c < 1.5$
$1.1 \leq d \leq 4$; and
$5.55 < e < 12.5$.

The TlBaCeCuO system is superconducting at 90 K.

In an embodiment, the superconductor composition of the present invention has a nominal composition $Tl_{2.2}Ba_2CeCu_3O_{10.3}$.

By the way of example and not limitation, examples of the new high temperature Tl-Ba-Ce-Cu-O superconductor of the present invention, and method of making same, will now be set forth.

EXAMPLE

A. The following reagents were utilized:
1. $Tl_2O_3$,
2. $BaO_2$,
3. $CeO_2$,
4. $CuO$.

B. The following procedure was followed:

1. $Tl_2O_3$, $BaO_2$, $CeO_2$, and $CuO$ were completely mixed in a molar ratio of 1.1:2:1:3.
2. The mixture was then completely ground and pressed into a pellet having a diameter of 7 mm and a thickness of approximately 1 to about 2 mm.
3. The pellet was placed in an alumina crucible.
4. The crucible and its content were placed into a tube furnace which had been heated to a temperature of approximately 900° to about 925° C. The crucible and its content were then heated in flowing oxygen for approximately 3 to about 5 minutes.
5. The crucible and its content were then furnace cooled.

Nominal $Tl_{2.2}Ba_2CeCu_3O_{10.3}$ samples prepared using this procedure, proved to be superconducting at 90 K. The samples had a dark grey color and were dense. The superconducting behavior of the samples was sensitive to both heating temperature and heating duration. Quenching of the samples depressed $T_c$ only slightly.

Figure 1:
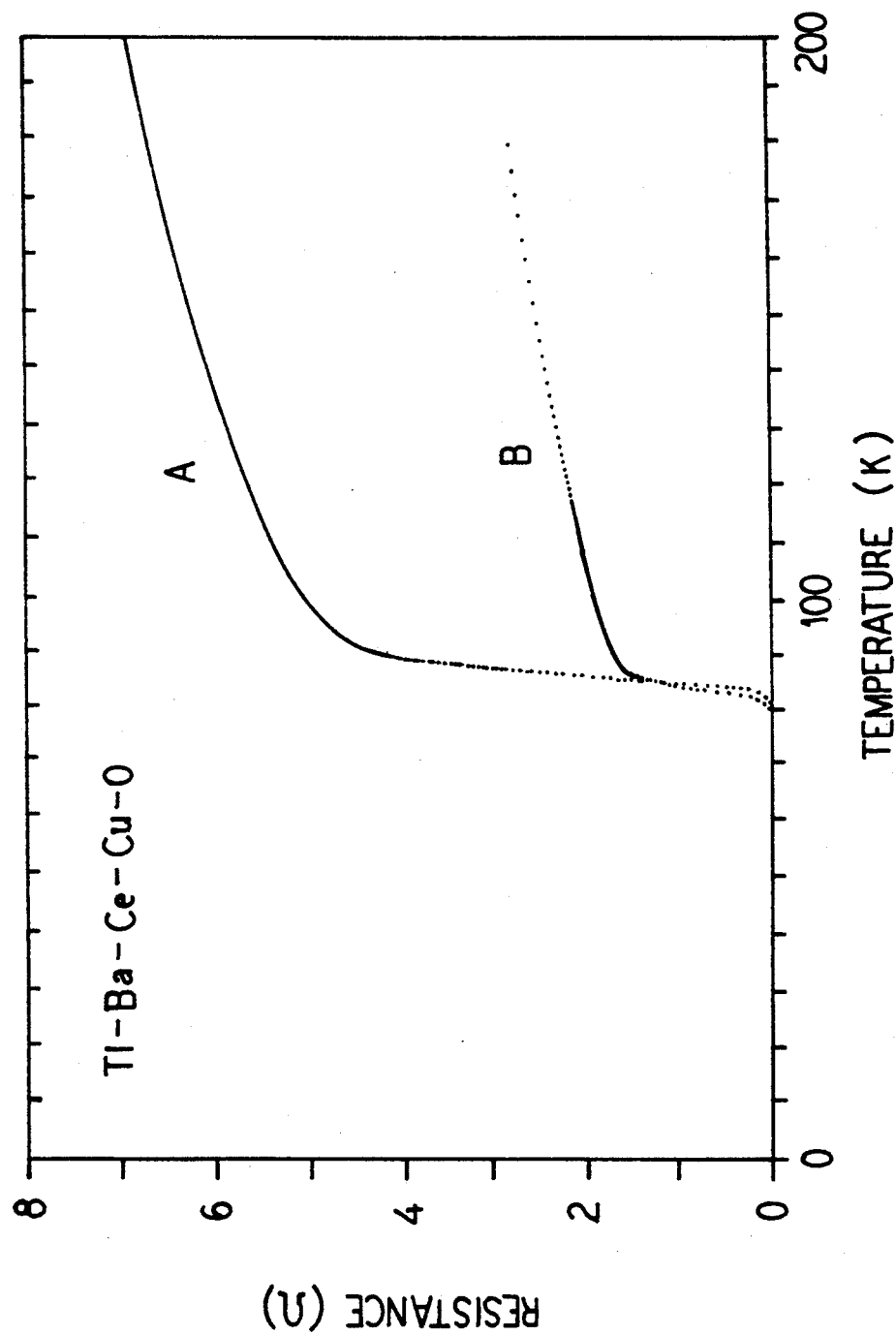
FIG. 1 illustrates a graph of resistance verses temperature of two nominal $Tl_{2.2}Ba_2CeCu_3O_{10.3}$ samples of the present invention.

FIG. 1 illustrates graphically resistance verses temperature for two nominal $Tl_{2.2}Ba_2CeCu_3O_{10.3}$ samples made pursuant to the procedure of this example. The two samples were made in different batches. The resistance was measured by a standard four-probe technique with silver paste contacts. Both resistance and ac susceptibility data were taken in a commercial ADP closed-cycle refrigerator with computer-control and processing.

As illustrated in FIG. 1, sample A had an onset temperature of 95 K., a mid-point temperature of 88 K., and a zero resistance temperature of 83 K. Sample B had an onset temperature of 90 K., a mid-point temperature of 85 K. and a zero resistance temperature of 80 K.

Figure 2:
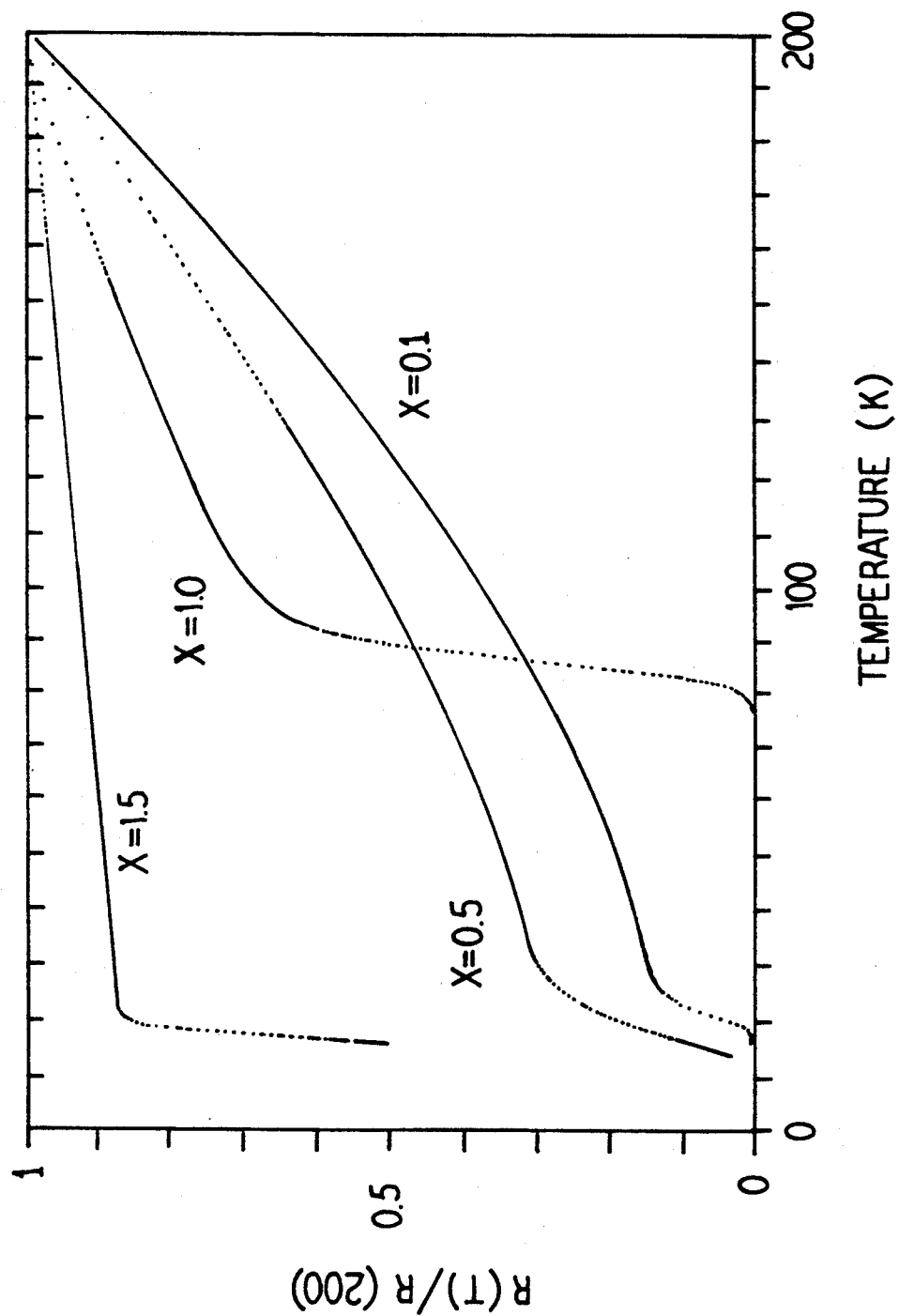
FIG. 2 illustrates a graph of R(T)/R(200) as a function of temperature for nominal $Tl_{2.2}Ba_2Ce_xCu_3O_y$ samples of the present invention, wherein $x=0.1, 0.5, 1.0$ and 1.5.

FIG. 2 illustrates graphically $R(T)/R(200)$ as a function of temperature for a series of samples with a starting composition of $Tl_{2.2}Ba_2Ce_xCu_3O_y$, where $x=0.1$, 0.5, 1.0 and 1.5. As illustrated in FIG. 2, the samples with a value of $x=0.1$, 0.5, and 1.5 all had a $T_c$ of about 20 K. As illustrated, only the sample with the intermediate value of $x=1.0$ was superconducting at 90 K. Therefore, the formation of a 90 K. superconducting phase of Tl-Ba-Ce-Cu-O has a strong dependence on the Ce concentration.

Figure 3:
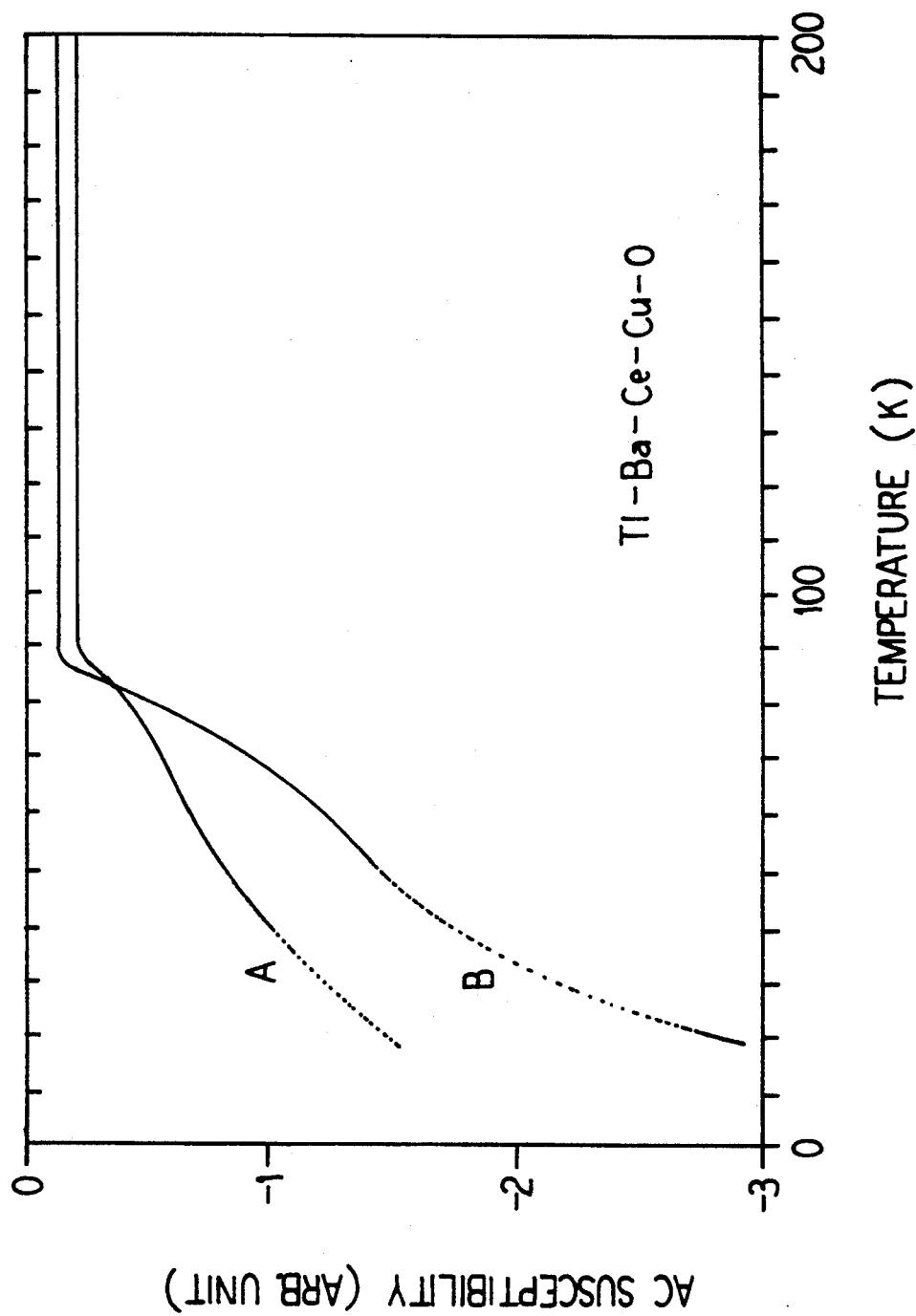
FIG. 3 illustrates a graph of the ac susceptibility as a function of temperature for two nominal $Tl_{2.2}Ba_2CeCu_3O_{10.3}$ samples of the present invention.

FIG. 3 illustrates graphically ac susceptibility verses temperature of the samples of FIG. 1. As the figure illustrates, the samples exhibit a diamagnetism onset at about 90 K., which is consistent with their superconducting transition temperatures measured resistively. The ac susceptibility signal decreases with decreasing temperature and does not saturate down to 15 K. In the present example, the signal at 15 K. was about 10–20% of that of a good quality Tl-Ba-Ca-Cu-O sample. Thermoelectric power determinations, from room temperature down to near the superconducting transition temperature, show n-type behavior for the sample of this example.

Figure 4:
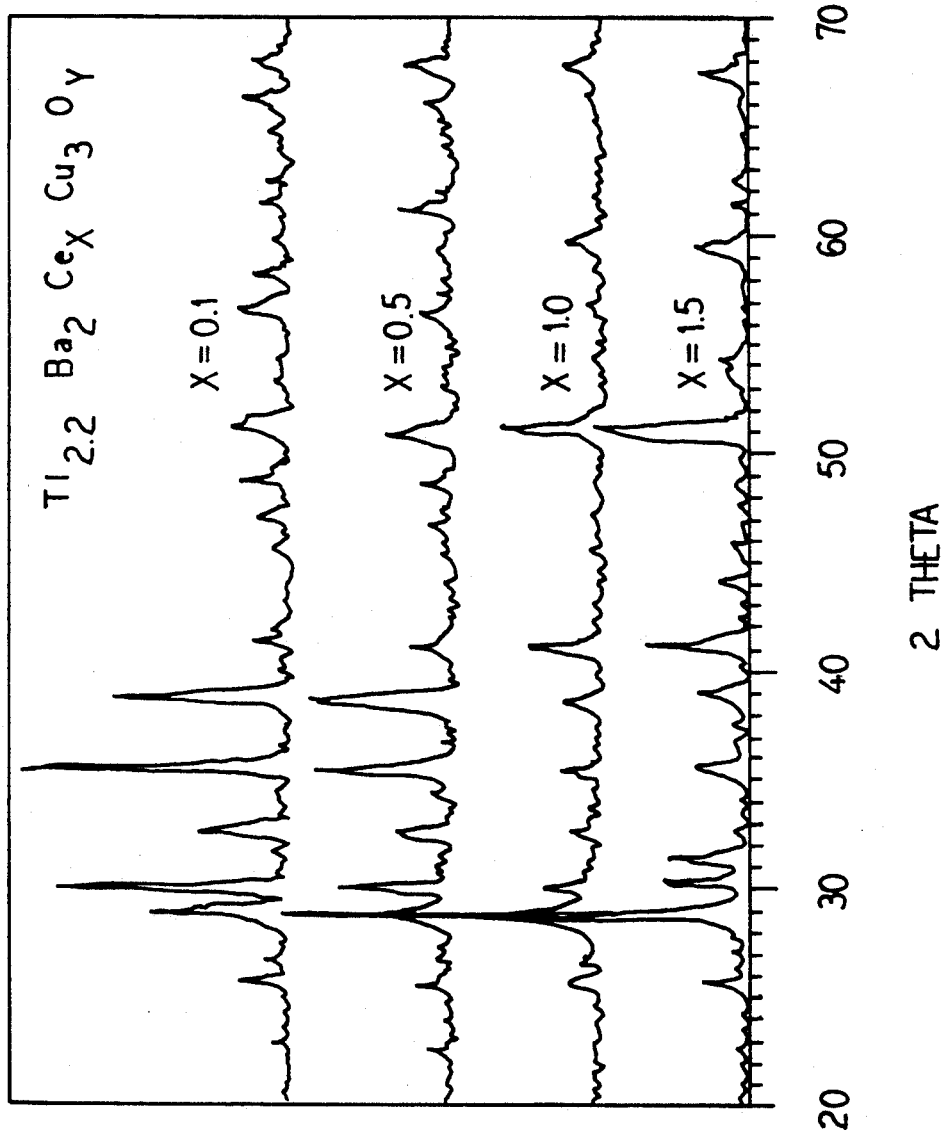
FIG. 4 illustrates the powder x-ray diffraction patterns of nominal $Tl_{2.2}Ba_2Ce_xCu_3O_y$ samples of the present invention, wherein $x=0.1, 0.5, 1.0$ and 1.5.

A powder x-ray diffraction analysis was used to attempt to identify the phase responsible for the 90 K. superconductivity. The powder x-ray diffraction was done for a number of Tl-Ba-Ce-Cu-O samples and a number of related samples. Powder x-ray diffraction studies were performed with Cu $K\alpha$ and radiation with the use of a DIANO DTM 1057 diffractometer. FIG. 4 illustrates the powder x-ray diffraction patterns for the samples of FIG. 2.

In general, the diffraction patterns of the Tl-Ba-Ce-Cu-O samples can be assigned to one of three phases: unreacted CuO; tetragonal $Tl_2Ba_2CuO_6$; and an unknown phase. In FIG. 4, the diffraction pattern of the unknown phase can be indexed to a cubic structure with lattice parameter of 4.400 A, which is very close to the lattice parameter of 4.386 A of the cubic $BaCeO_3$. This is omitting the $2\Theta=25°$ peak in the figure.

If the 28.7° peak is assigned to the unidentified phase and assuming that the 30.0° peak represents the tetragonal, $Tl_2Ba_2CuO_6$, the ratios of the unidentified phase to the $Tl_2Ba_2CuO_6$ phase are 0.5 for $x=0.1$, 1.5 for $x=0.5$, 5 for $x=1.0$, and 6 for $x=1.5$, respectively.

All four samples consist primarily of the two phases, but only the sample with $x=1.0$ is superconducting at 90 K. The inventors believe that if the $Tl_2Ba_2CuO_6$ phase is responsible for the 90K superconductivity, it, most probably, has been doped by Ce, and if the unidentified phase is responsible for the 90K superconductivity, it must consist of all four metallic elements, Tl, Ba, Ce, and Cu.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A superconductor having the composition:

Tl-Ba-Ce-Cu-O

2. A superconductor having the following approximate stoichiometry:

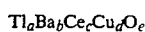

$Tl_aBa_bCe_cCu_dO_e$ wherein:
$1.1 \leq a \leq 2.2$;
$1.8 \leq b \leq 2.2$;
$0.5 < c < 1.5$
$1.1 \leq d \leq 4$; and
$5.55 < e < 12.5$.

3. A composition that is superconducting at 90 K. having the following approximate nominal stoichiometry:

$Tl_{2.2}Ba_2CeCu_3O_{10.3}$.

4. A high temperature superconducting material including a $Tl_2Ba_2CuO_6$ phase that has been doped by Ce.

5. A superconductor having the general formula TlBaCeCuO and a tetragonal $Tl_2Ba_2CuO_6$ phase.

6. A method for making a high temperature superconductor comprising the steps of:
 a) mixing $Tl_2O_3$, $BaO_2$, $CeO_2$, and CuO;
 b) heating the mixture in flowing $O_2$; and
 c) cooling the mixture.

7. The method of claim 6 wherein $Tl_2O_3$, $BaO_2$, $CeO_2$, and CuO are mixed in a molar ratio of 1.1:2:1:3.

8. The method of claim 6 wherein the mixture is heated to a temperature of approximately 900° to about 925° C.

9. The method of claim 6 wherein the mixture, prior to being heated, is pressed into a pellet.

10. The method of claim 9 wherein the pellet is heated to a temperature of approximately 900° to about 925° C.

11. The method of claim 8 wherein the pellet is heated in a tube furnace and flowing oxygen at a temperature of approximately 900° to about 925° C.

12. The method of claim 8 wherein the pellet is heated in flowing $O_2$ for approximately 3 to about 5 minutes.

13. The method of claim 8 wherein the pellet is furnace cooled.

14. A method for making a high temperature superconductor including a $Tl_2Ba_2CuO_6$ phase comprising the steps of:

heating a TlBaCeCuO mixture in flowing oxygen.

15. The method of claim 14 wherein the TlBaCeCuO mixture is created by mixing $Tl_2O_3$, $BaO_2$, $CeO_2$, and CuO.

16. The method of claim 14 wherein the mixture is heated to approximately 900° to about 925° C.

17. The product of the process of claim 6.

18. The product of the process of claim 14.

19. The product of the process of claim 15.

* * * * *